United States Patent
Larsen et al.

(10) Patent No.: US 7,761,770 B2
(45) Date of Patent: Jul. 20, 2010

(54) DISK CONTROLLER ARCHITECTURE TO ALLOW ON-THE-FLY ERROR CORRECTION AND WRITE DISRUPTION DETECTION

(75) Inventors: Troy D. Larsen, North Ogden, UT (US); Adam T. Arnell, Syracuse, UT (US); Martin L. Culley, Ogden, UT (US); Don W. Wallentine, Mantua, UT (US); Facil T. Feye, West Jordan, UT (US)

(73) Assignee: EMC Corporation, Hopkinton, MA (US)

(*) Notice: Subject to any disclaimer, the term of this patent is extended or adjusted under 35 U.S.C. 154(b) by 1053 days.

(21) Appl. No.: 11/478,244

(22) Filed: Jun. 29, 2006

(65) Prior Publication Data

US 2006/0248433 A1 Nov. 2, 2006

Related U.S. Application Data

(63) Continuation-in-part of application No. 10/447,923, filed on May 29, 2003, now Pat. No. 7,587,656.

(51) Int. Cl.
*H03M 13/00* (2006.01)
(52) U.S. Cl. .................... 714/758; 714/763; 714/769
(58) Field of Classification Search .............. 714/758, 714/763, 769
See application file for complete search history.

(56) References Cited

U.S. PATENT DOCUMENTS 5,422,856 A * 6/1995 Sasaki et al. ........... 365/230.03
5,748,401 A * 5/1998 Kawai .................... 360/78.14
6,219,814 B1 * 4/2001 Coker et al. ............... 714/763
7,117,387 B2 * 10/2006 Katsuragi et al. ............ 714/6
7,299,314 B2 * 11/2007 Lin et al. ................... 711/103

OTHER PUBLICATIONS

NN83102234: Method for Determining the Physical Location of an Unreadable Logical Sector; IBM Technical Disclosure Bulletin; vol. No. 26; Issue No. 5; Oct. 1, 1983.*

* cited by examiner

*Primary Examiner*—Guy J Lamarre
(74) *Attorney, Agent, or Firm*—Stephen C. Beuerle; Procopio Cory Hargreaves & Savitch LLP

(57) ABSTRACT

Error correction in a disk drive is performed by error correction circuitry which accepts data read from a data storage medium. The error correction circuitry performs both block error correction in a first data domain and sector error correction in a second data domain. A sector FIFO buffer is used to facilitate the error correction in real time, or "on-the-fly." The sector FIFO buffer also enables conversion of the corrected data to the first data domain. The error correction circuitry also generates an ECC block comprising a plurality of sectors and writes the ECC block. The circuitry generates a tag prior to writing the ECC block and adds the tag to each of a plurality of sectors. During a read operation, the circuitry detects a write disruption when the tags for all of the plurality of sectors in the ECC block are not identical.

11 Claims, 9 Drawing Sheets

DISK CONTROLLER ARCHITECTURE TO ALLOW ON-THE-FLY ERROR CORRECTION AND WRITE DISRUPTION DETECTION

CROSS-REFERENCE TO RELATED APPLICATIONS

The present application claims priority and is a continuation-in-part application of U.S. patent application Ser. No. 10/447,923 filed May 29, 2003 now U.S. Pat. No. 7,587,656.

TECHNICAL FIELD

The present invention relates in general to data storage devices and, more particularly, to data storage devices which are capable of detecting and correcting errors when stored data is retrieved.

BACKGROUND

Computers use various types of peripheral devices for information storage. One known type of information storage device is a disk drive, in which a rotatable disk has a magnetic surface that is conceptually divided into a plurality of concentric circular tracks. A plurality of blocks of data are stored along each track, and each block of data includes a plurality of sectors. Each sector in each block includes first and second portions. The second portion contains sector-level information that can be used to detect and/or correct errors in information stored in the first portion of that same sector. In most of the sectors, the first portion contains user data. In the remaining sectors, the first portion contains block-level error correction information, which can be used to correct errors found in the user data of other sectors. While devices using this type of block format have been generally adequate for their intended purposes, they have not been satisfactory in all respects.

For example, when a host computer provides the device with some user data which is to be written to a specified block, and which constitutes only a portion of the user data in that block, existing devices typically write all information in the entire block to the disk in order to facilitate generation of the block-level information, which is a function of all of the user data stored in that block. However, writing the entire block to the disk is relatively time consuming, and thus undesirable.

A different consideration is that, when a host requests that specified user data be read from the disk, and when the specified data is only a portion of the user data in a block, existing devices will typically read the entire block from the disk, so that they will be in a position to use the block-level information to attempt to correct any detected errors that cannot be corrected at the sector level. This increases the average time required to read the requested data.

Still another consideration is that, when sectors of a block are being successively read from the disk, and an error is detected in one of the sectors, an attempt to correct the error at the sector level is often still in progress when the next sector becomes available, such that the device is not ready to begin correcting any error which may be present in that next sector. Thus, the device is not capable of correcting errors as fast as the sectors can be read from the disk. As a result, the system occasionally has to discard a sector which it has just read, wait for the disk to carry out a full revolution, and then read the sector again, by which time the correction of the prior sector will have been completed. However, in any situation where an error is detected in a sector, this can greatly increase the amount of time needed to complete the transfer of the requested data to the host.

SUMMARY

Error correction in a disk drive is performed by error correction circuitry which accepts data read from a data storage medium. The error correction circuitry performs both block error correction in a first data domain and sector error correction in a second data domain. A sector FIFO buffer is used to facilitate the error correction in real time, or "on-the-fly." The sector FIFO buffer also enables conversion of the corrected data to the first data domain. The error correction circuitry also generates an ECC block comprising a plurality of sectors and writes the ECC block. The circuitry generates a tag prior to writing the ECC block and adds the tag to each of a plurality of sectors. During a read operation, the circuitry detects a write disruption when the tags for all of the plurality of sectors in the ECC block are not identical.

DESCRIPTION OF DRAWINGS

These and other features and advantages of the invention will become more apparent upon reading the following detailed description and upon reference to the accompanying drawings.

DETAILED DESCRIPTION

Figure 1:
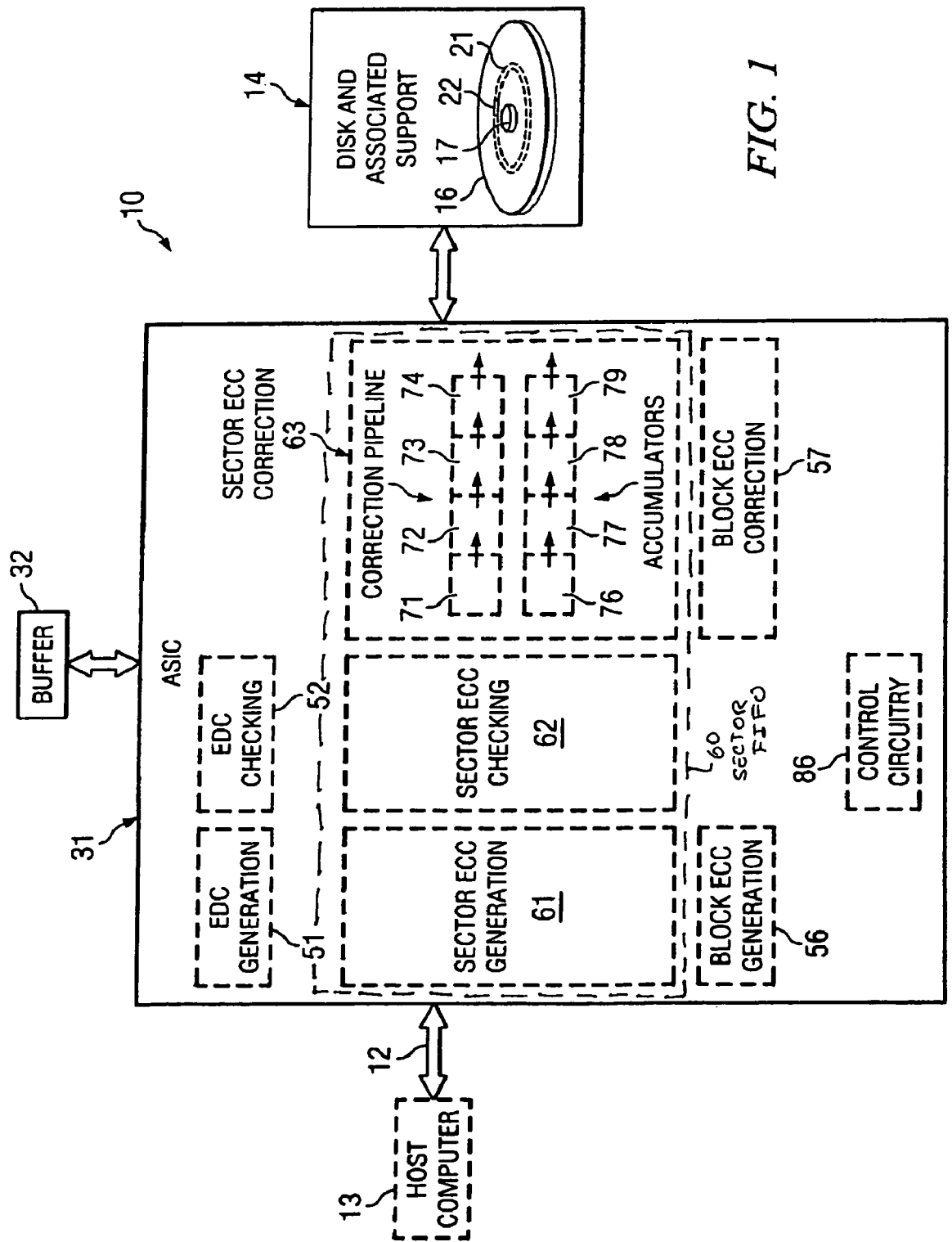
FIG. 1 is a block diagram of an apparatus which is an information storage system that embodies aspects of the present invention.

FIG. 1 is a diagrammatic view of an apparatus which is an information storage system 10, and which embodies aspects of the present invention. The system 10 can be coupled through an interface 12 to a host computer 13. The host computer 13 is shown in broken lines in FIG. 1, because it is not part of the information storage system 10. In the disclosed embodiment, the interface 12 conforms to an industry standard commonly known as the Universal Serial Bus (USB) protocol. However, the interface 12 could alternatively conform to any other suitable known or future protocol, one example of which is the protocol commonly known as the IEEE 1394 protocol.

The system 10 includes a section 14 which includes structure of a type known in the art, and which is therefore illustrated and described only in limited detail, to the extent needed to facilitate an understanding of the present invention. In particular, the section 14 includes a disk 16 which is mounted on a rotatable spindle 17. A not-illustrated motor can rotate the spindle 17, to thereby effect rotation of the disk 16. The side of the disk 16 which is visible in FIG. 1 has a coating of a magnetic material, which can magnetically store information in a manner known in the art. This coating is conceptually divided into a plurality of concentric circular tracks, one of which is shown diagrammatically at 21 by two broken lines. Each of the tracks has information stored therealong in a known format, which includes a series of successive blocks or frames of data. One of the blocks or frames along the track 21 is shown diagrammatically at 22 in FIG. 1. Data within each block is formatted in a manner which is known in the art, and which will be described in more detail later.

The section 14 also includes electrical and mechanical structure which is needed to support operation of the disk 16, but which is not illustrated and described in detail because it is known in the art. For example, this support structure includes a magnetic read/write head which is movably supported, and which can read and write information to and from the tracks of the magnetic coating on the disk 16. Further, it includes an actuator of a known type which effects the movable support of the head, along with circuitry of a known type which controls the actuator and processes electrical signals traveling to and from the read/write head.

The system 10 also includes a circuit 31 which, in the disclosed embodiment, is implemented in the form of an Application Specific Integrated Circuit (ASIC). However, the circuitry could alternatively be implemented in any suitable form other than an ASIC. The system 10 also includes a buffer memory 32, which is electrically coupled to the circuit 31. Several different portions of the circuitry within the circuit 31 are shown diagrammatically in broken lines as labeled rectangular blocks. Each of these blocks is discussed briefly below.

More specifically, the circuit 31 includes an error detection code (EDC) generation circuit 51, and an EDC checking circuit 52. When data from the host computer 13 is being written to the disk 16, the EDC generation circuit 51 uses the data to generate a code, which is stored on the disk 16 along with the data. Later, when the data is read back from the disk 16, the associated code is read back with the data, and then is used by the EDC checking circuit 52 to check for any discrepancies between the data which was sent to the disk and the data which is read back from the disk. The EDC code used in the disclosed embodiment is a type of error detection code which is known in the art, but could alternatively be any other suitable error detection code.

The circuit 31 also includes a block error correcting code (ECC) generation circuit 56, and a block ECC correction circuit 57. When user data from the host computer 13 is being stored on the disk 16, the block ECC generation circuit 56 uses that data to generate block ECC information or "residue", which is stored with the data on the disk 16. When the data is later read back, it is checked for errors, for example by the EDC checking circuit 52. If errors are detected, then if necessary the block ECC information is also read back, and the block ECC correction circuit 57 can use this block ECC information to attempt to correct the errors detected in the user data. The disclosed embodiment uses a form of block ECC information which is known in the art, but it would alternatively be possible to use any other form which is suitable.

The circuit 31 also includes an optional sector first-in, first-out (FIFO) random access memory 60, a sector ECC generation circuit 61, a sector ECC checking circuit 62, and a sector ECC correction circuit 63. The optional sector FIFO 60 captures disk channel data and allows the sector ECC generation circuit 61, the sector ECC checking circuit 62, and the sector ECC correction circuit 63 to operate without any delays, or "on-the-fly." When user data from the host computer 13 is being stored on the disk 16, the sector ECC generation circuit 61 uses that data to generate sector ECC information or "residue", which is stored on the disk 16 with the data. When the user data is subsequently read back from the disk 16, the associated sector ECC information is also read back, and is used by the sector ECC checking circuit 62 to evaluate whether there is a discrepancy between the user data sent to the disk 16 and the same user data as read back from the disk. If a discrepancy is detected, then the sector ECC correction circuit 63 uses the sector ECC information to attempt to correct the user data. The disclosed embodiment uses a form of sector ECC information which is known in the art, but it would alternatively be possible to use any other form which is suitable.

In one embodiment, the sector ECC correction circuit 63 includes a correction pipeline having four stages 71-74. Other embodiments may incorporate any number of stages. When user data in a given sector needs to be corrected, the sector ECC information from that sector is supplied to the first stage 71 of the pipeline. This information from the sector then moves successively through the stages 71-74, where each stage carries out a different successive part of the process for attempting to correct the associated user data, which is in the buffer 32. As mentioned above, the disclosed embodiment uses a form of sector ECC information which is known in the art, and the techniques for utilizing that information in several successive operations to correct detected errors is also known in the art. Therefore, the internal operation of the various stages 71-74 of the pipeline is not shown and described in detail here.

The sector ECC correction circuit 63 also includes four accumulators 76-79, each of which is associated with a respective one of the correction stages 71-74. Each time that sector information is moved from one of the stages 71-74 to the next successive stage, the value in the corresponding one of the accumulators 76-79 is simultaneously moved to the next successive accumulator. The circuit 31 also includes a portion 86 which contains control circuitry, and which is responsible for controlling and synchronizing all of the other circuitry within the circuit 31, including the circuit portions which are shown at 51-52, 56-57 and 61-63.

Figure 2:
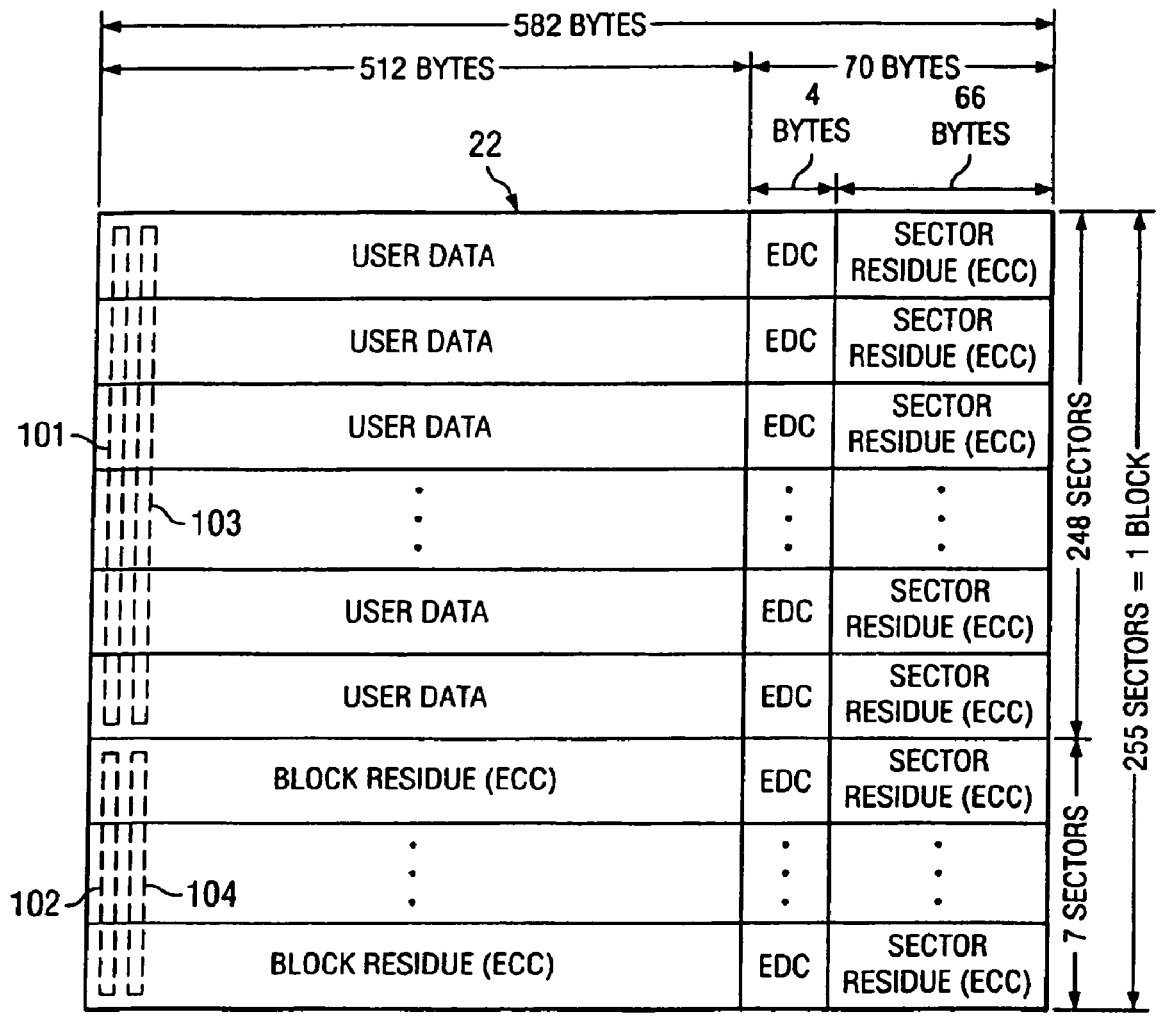
FIG. 2 is a diagram showing a format for a block or frame of data which is stored on a disk that is a component of the system of FIG. 1.

FIG. 2 is a diagram showing in more detail the format of the block 22 of information which is stored on the disk 16 of FIG. 1. Each row in the diagram of FIG. 2 represents a respective sector of information. As evident from the right side of FIG. 2, the block 22 in the disclosed embodiment has a maximum of 255 sectors. These sectors may be stored in succession along the track 21 of FIG. 1. Thus, as the read/write head moves along the track 21, it first encounters the sector at the top of FIG. 2, then encounters the sector immediately below that, and so forth. The head encounters the information within each sector in a manner which corresponds to movement from left to right in FIG. 2.

As evident from the top of FIG. 2, in one embodiment each sector includes a maximum of 582 8-bit bytes, organized as a field of 512 bytes, followed by a field of 4 bytes, followed by a field of 66 bytes. Each 4-byte field contains an EDC value which was generated from the 512-byte field of that sector by the EDC generation circuit 51 of FIG. 1. Each 66-byte field contains sector ECC information or residue which was generated from the 512-byte field of that sector by the sector ECC generation circuit 61 of FIG. 1. In the first 248 sectors of the block 22, the 512-byte field contains user data received from the host computer 13. In the last several sectors of the block 22 (7 in the present embodiment), the 512-byte field contains block ECC information or residue which was generated from the user data in the first 248 sectors by the block ECC generation circuit 56 of FIG. 1.

With reference to the left side of FIG. 2, a broken-line rectangle 101 is a diagrammatic representation of 248 bytes of data, each of which is the first byte in a respective one of the first 248 sectors in the block 22. A further broken-line rectangle 103 diagrammatically represents another 248 bytes, each of which is the second byte in a respective one of the first 248 sectors in the block 22. Another broken-line rectangle 102 designates 7 bytes of data, each of which is the first byte in a respective one of the last 7 sectors in the block 22. A broken-line rectangle 104 designates 7 more bytes of data, each of which is the second byte in a respective one of the last 7 sectors in the block 22.

The 7 bytes at 102 represent the block ECC information for the 248 user data bytes at 101. In other words, the 7 bytes of block ECC information at 102 can be used to try to correct an error which may be present in one or more of the 248 bytes of data at 101. Similarly, the 7 bytes at 104 are the block ECC information for the 248 bytes at 103, and can be used to attempt to correct an error which may be present in one or more of the 248 bytes at 103.

It should be noted that, as discussed above, the last 70 bytes of each sector contain information for detecting and/or correcting errors which may be present in the first 512 bytes of that same sector. Thus, with reference to the last sector in the block 22 of FIG. 2, or in other words the sector at the bottom of FIG. 2, the first 512 bytes of this sector contain block ECC information which can be utilized to correct errors which may be present somewhere in the user data in the first 248 sectors. In contrast, in one embodiment, the last 70 bytes of this last sector are not used to correct errors in other sectors, but instead are used to detect and/or correct errors in the 512-byte field of block ECC information of this last sector.

Assume hypothetically that, when the very first byte of user data in the block 22 is read back from the disk 16, it contains an error. In FIG. 2, this would be the byte of data located at the upper end of the broken-line rectangle 101. The circuit 31 of FIG. 1 would use the last 70 bytes of this first sector, including the 4 bytes of EDC information and the 66 bytes of sector ECC information, to look for and detect this error. After detecting the error, the circuit 31 would use the 66 bytes of sector ECC information from that first sector to try to correct the detected error. If this attempt at sector-level correction was not successful, then the circuit 31 would read all 255 sectors in the block 22, and use the 7 bytes of block ECC information at 102 to attempt to correct the error detected in the first byte within the 248 bytes at 101.

With reference to FIG. 1, and as evident from the foregoing discussion, the circuit 31 is capable of operating in a write mode, in which it accepts data from the host computer 13 and causes it to be stored on the disk 16. The circuit 31 is also capable of operating in a read mode, in which the host computer 13 requests data and then the circuit 31 causes the data to be read from disk 16 and to be supplied to the host computer 13. Each of these modes of operation is discussed below, beginning with the read mode.

Figure 3:
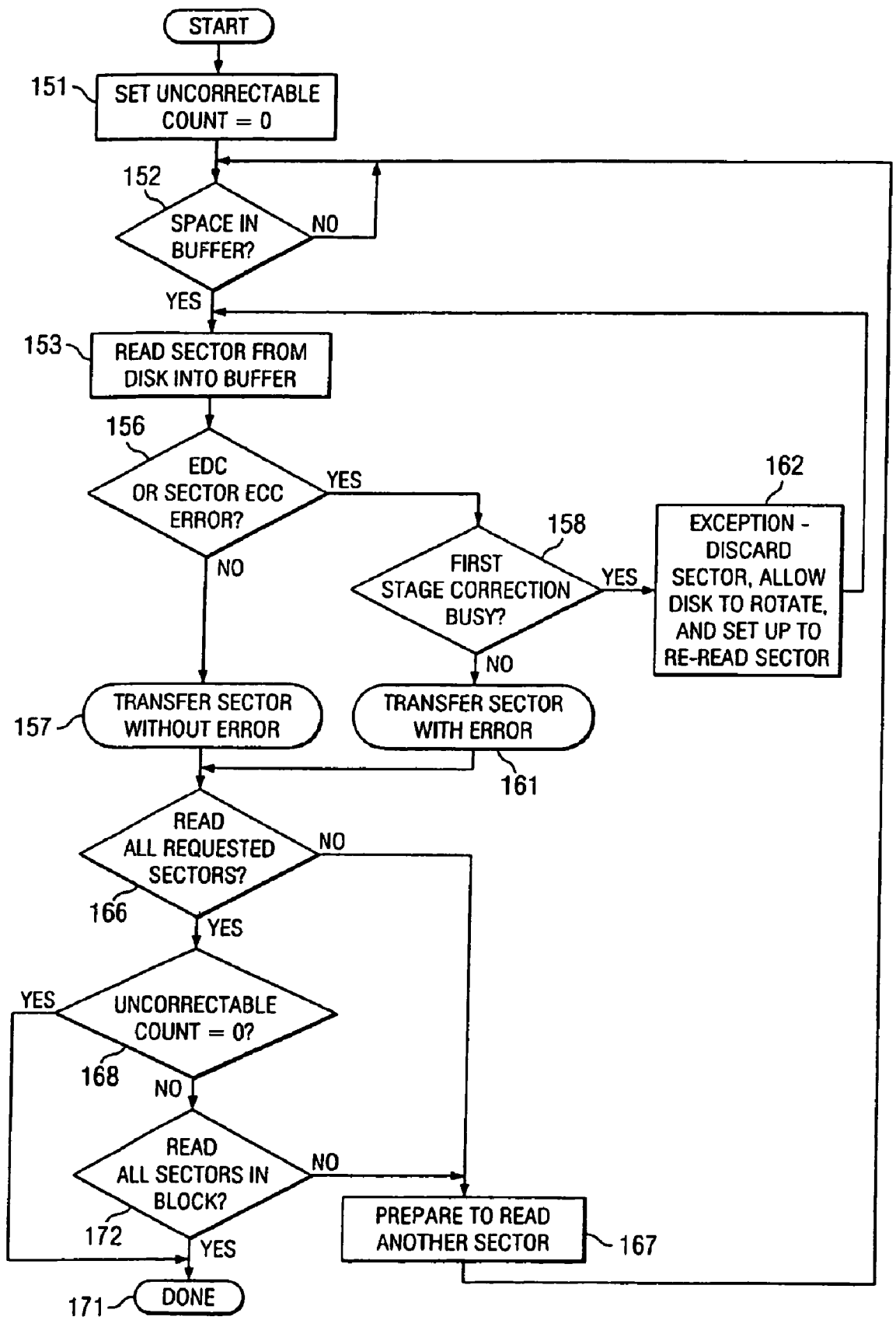
FIGS. 3-6 are high-level flowcharts showing sequences carried out in the system of FIG. 1 in order to read data from a data block such as that shown in FIG. 2, while detecting and correcting any errors in the data.

In more detail, FIG. 3 is a high-level flowchart showing a sequence which is carried out by the circuit 31 in order to read data from the disk 16 and supply it to the host computer 13. In the disclosed embodiment, certain operations are carried out under control of combinational logic, and the flowchart of FIG. 3 thus does not represent merely a software or firmware program which is executed by a processor, but instead represents a sequence which is carried out by hardware under appropriate control. Of course, even though the disclosed embodiment effects much of the control with combinational logic, it would alternatively be possible to implement some or all of that control using a processor which executes a firmware or software program.

The sequence of FIG. 3 begins when the host computer 13 sends to the circuit 31 a request for the circuit 31 to read specified user data from the disk 31. For purposes of this discussion, it is assumed that the host computer 13 makes a request for at least some of the user data which is stored in the block 22 of FIG. 2. The sequence of FIG. 3 begins at 151, where the circuit 31 initializes an "uncorrectable" count value to zero. This value represent a count of the number of sectors read from the block 22 which had errors that could not be corrected using the 66 bytes of sector ECC information located within the sector. From block 151, control proceeds to block 152, where the circuit 31 checks to see whether there is space available in the buffer memory 32 of FIG. 1. If not, then the circuit 31 waits at block 152 until space becomes available in the buffer memory 32. When space is available, control proceeds to block 153, in which the circuit 31 causes a sector to be read from the disk 16, where the sector contains at least some of the user data that the host computer 13 requested or block ECC information.

Control then proceeds to block 156, where the 4 byte field of EDC information from the sector is used by the EDC checking circuit 52 to look for errors in the 512 bytes of user data in that sector, and where the 66 bytes of sector ECC information are used by the sector ECC checking circuit 62 to look for errors in the same 512 bytes of user data. If no error is detected, then control proceeds to block 157, where responsibility for the sector is transferred to another portion of the circuit 31 (discussed later), along with an indication that the sector does not have an error.

On the other hand, if it is determined at block 156 that the sector does have an error, control proceeds to block 158, where the circuit 31 checks the sector ECC correction circuit 63, in order to determine whether the first stage 71 of the correction pipeline is currently busy trying to correct some other sector. In this regard, the section correction circuit has been structured as a pipeline of several successive stages 71-74 so that, if a problematic sector is given to the initial stage 71, it will typically have moved to the stage 72 by the time that the next successive sector has been read from the disk 17. Thus, if that next sector also has an error, it can be immediately turned over to the initial stage 71. Therefore, due to the pipeline configuration, the first stage 71 will almost never be found to be busy at block 158, and control will normally proceed from block 158 to block 161. In block 161, responsibility for the sector is transferred to another portion of the circuit 31 (discussed later), with an indication that an error has been detected.

In rare instances, it may be determined in block 158 that the first pipeline stage 71 is busy. In that event, control proceeds from block 158 to block 162, where the circuit 31 discards the sector that it has just read, waits while the disk 16 carries out substantially a full revolution so that the read/write head is positioned back at the beginning of the same sector, and then sets up to read that sector again. Control then proceeds from block 162 back to block 153, in order to read the same sector again. By the time the control sequence reaches block 158 again, the stage 71 should have finished its processing of the prior sector.

As discussed above, blocks 157 and 161 each transfer responsibility for a sector to another portion of the circuit, with an indication that the sector either does or does not have an error. After responsibility for a sector has been transferred in this manner, the circuitry responsible for reading sectors is ready to read another sector which contains user data requested by the host computer. In particular, from each of blocks 157 and 151, control proceeds to block 166, where the circuit 31 checks to see whether it has read from the disk 16 all of the sectors that contain user data requested by the host computer 13. If not, then control proceeds to block 167, where the circuit 31 prepares to read another sector from the disk 16. Control then proceeds back to block 152, in order to initiate the process of reading that sector.

On the other hand, if the circuit 31 determines at block 166 that it has read all of the user data requested by the host, then control proceeds to block 168, where the circuit 31 checks the current value of the uncorrectable count. As discussed above in association with block 151, this count represents the number of sectors read from the block 22 in which the user data contained an error that could not be corrected by the pipeline stages 71-74 through use of the sector ECC information in that same sector. Each time such a sector is encountered, the uncorrectable count is incremented, as described in more detail later.

If it is determined at block 168 that the count is zero, then all user data requested by the host computer 13 has been read from the disk 16, and either no errors were detected, or any detected errors were successfully corrected by the pipeline stages 71-74. Control therefore proceeds to block 171, which represents the end of the sequence of FIG. 3. In contrast, if it is determined in block 168 that the count is greater than zero, it means that at least one sector had a detected error which the pipeline stages were not able to correct using the sector ECC information from that same sector. Consequently, this means that the circuit 31 will need to try to correct each such error using the block ECC information contained in the last 7 sectors of the block 22. But in order to try to correct one or more errors using this block ECC information, the circuit 31 must first read all of the remaining sectors in the block 22, including the last 7 sectors that contain the block ECC information.

Accordingly, control proceeds from block 168 to block 172, where the circuit 31 checks to see whether it has read all sectors in the block 22. If not, then control proceeds to block 167, where the circuit 31 prepares to read another sector from the block 22, and then returns to block 152. Eventually, the circuit 31 will determine at block 172 that it has read all of the 255 sectors in the block 22, and has released them all at 157 and 161 to the other portion of the circuit 312. Control will then proceed from block 172 to block 171.

Figure 4:
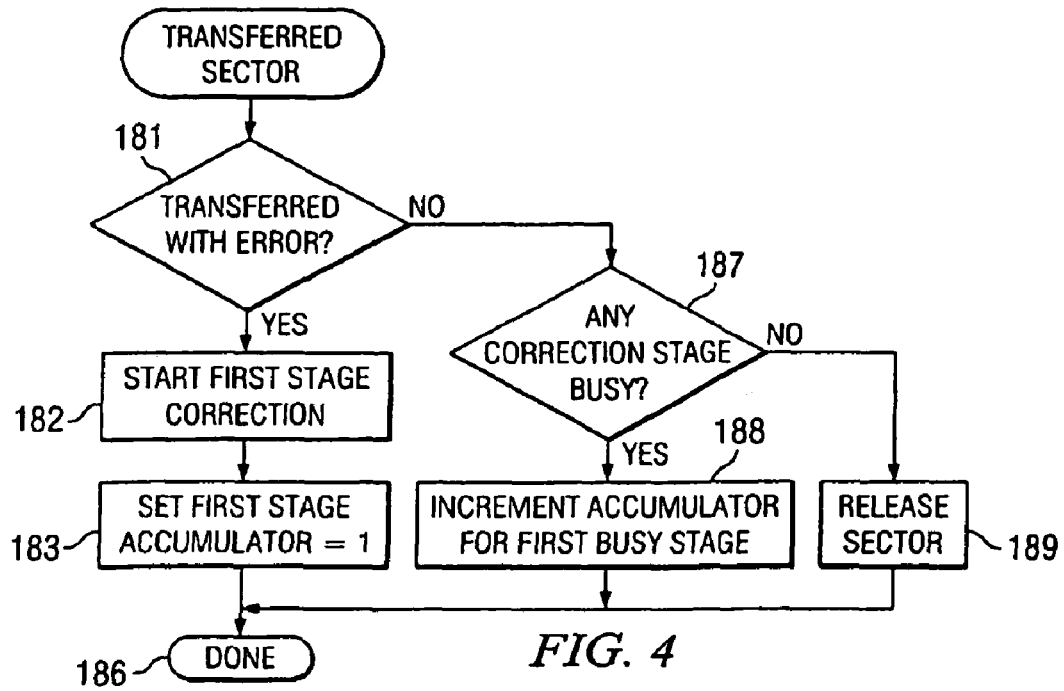

FIG. 4 is a high-level flowchart showing another portion of the sequence of operations carried out by the circuit 31 when it is reading data from the disk 16. As discussed above, blocks 157 and 161 in FIG. 3 each transfer responsibility for a given sector to another portion of the circuit 31, with an indication of whether or not an error has been detected in that sector. FIG. 4 shows the sequence of operations carried out by the portion of the circuit 31 to which the responsibility for sectors is transferred.

At block 181, the relevant portion of circuit 31 checks to see whether the sector transferred to is accompanied by an indication that an error was detected. If so, then it has already been determined at block 158 of FIG. 3 that the first stage 71 of the correction pipeline is not busy, and so at block 182 the sector is turned over to the hardware of the first stage 71 of the correction pipeline. Then, in block 183, the accumulator 76 which is associated with the first stage 71 is initialized to a value of 1. Control then proceeds from block 183 to block 186, which is the end of the sequence of FIG. 4. The hardware of the correction pipeline will process the sector in the first stage 71, then automatically transfer the sector to stage 72 for more processing, then automatically transfer it to stage 73 for still more processing, and then automatically transfer it to stage 74 for still more processing. As the sector information is moved successively through the stages 71-74, the associated accumulator value is automatically moved successively through the accumulators 76-79.

Referring again to block 181 in FIG. 4, if it is determined that no error was detected in the sector for which responsibility has been transferred, control proceeds from block 181 to block 187, where the circuit 31 checks to see whether any of the stages 71-74 is currently processing a sector. If any of the stages 71-74 is processing a sector, then it means that there is a sector in the pipeline which has not yet been turned over to the host computer 13. This in turn means that the later sector which is currently being processed according to the flowchart of FIG. 4 cannot be turned over to the host computer yet, because sectors need to be turned over in sequence, and the prior sector is still undergoing efforts to correct an error.

Accordingly, control proceeds from block 187 to block 188, where the circuit 31 checks the stages 71-74 in succession, until it encounters one of them which is currently busy, and then it increments the value in the accumulator associated with that stage. For example, if the circuit 31 checked the stage 71 and found it was not busy, then checked the stage 72 and found it was not busy, and then checked the stage 73 and found it was busy, the circuit 31 would increment the count in the accumulator 78 which is associated with the stage 73.

When a sector is eventually discharged from the correction stage 74, the accumulator 79 will contain a count representing the sector which is being released, plus the number of sectors which were thereafter read from the disk without any detected error.

For example, if the sector being released from stage 74 was followed by a sector which also had an error, the count in accumulator 79 will be 1. If the sector being released from stage 74 was followed by a sector without an error and then a sector with an error, the count in accumulator 79 will be 2. If the sector being released from stage 74 was followed by two sectors without error and then a sector with an error, the count in accumulator 79 will be 3. In effect, the count in the accumulator 79 represents the number of sectors which can be simultaneously released for further processing when the pipeline stage 74 finishes processing the first of those sectors. From block 188, control proceeds to block 186, which is the end of the sequence shown in FIG. 4.

Referring again to block 187 in FIG. 4, if it is determined that none of the stages 71-74 of the correction pipeline is currently busy, then control proceeds to block 189, where the error-free sector being handled by the sequence of FIG. 4 is released to another portion of the circuit 31 (discussed later). Control then proceeds to block 186.

Figure 5:
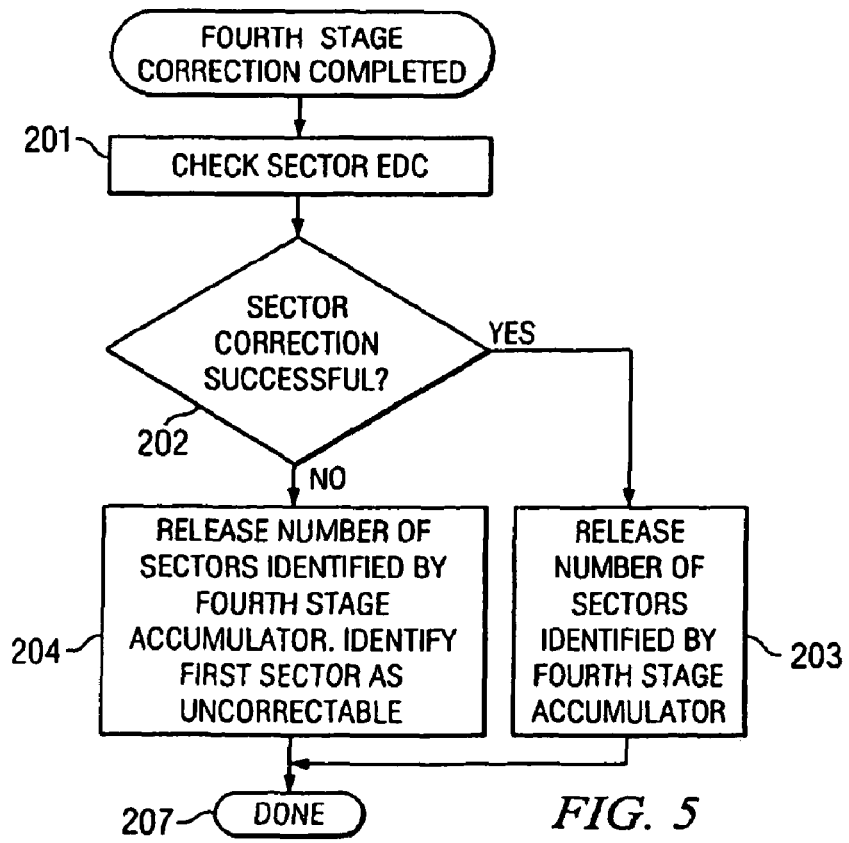

FIG. 5 is a high-level flowchart showing a sequence which is triggered when a sector is discharged from the last stage 74 of the correction pipeline. At block 201, the 4-byte EDC information from that sector is used to check the user data which has been corrected by the pipeline, in order to evaluate whether the correction attempted by the stages 71-74 of the correction pipeline was successful, or whether an error is still present. Then, at block 202, the result of this evaluation is checked.

If it is determined at block 202 that the correction pipeline successfully corrected the error, then at block 203 the circuit 31 releases the number of sectors identified by the fourth stage accumulator 79 to another portion of the circuit 31 (discussed later), with an indication that each such sector has no known error. In contrast, if it determined at block 202 that the sector being released from stage 74 still has an error, then at block 204 the circuit 31 releases the number of sectors identified by the count in the fourth stage accumulator 79 to the other portion of the circuit 31 (discussed later), with an indication that the first sector in this group contains an uncorrectable error. In this regard, the reference to an uncorrectable error merely means that the stages 71-74 of the correction pipeline were not able to correct this error, but does not mean that the circuit 31 will not be able to correct the error in some other manner, for example using the block ECC information in a manner discussed later. From each of the blocks 203 and 204, control proceeds to block 207, which represents the end of the sequence shown in FIG. 5.

Figure 6:
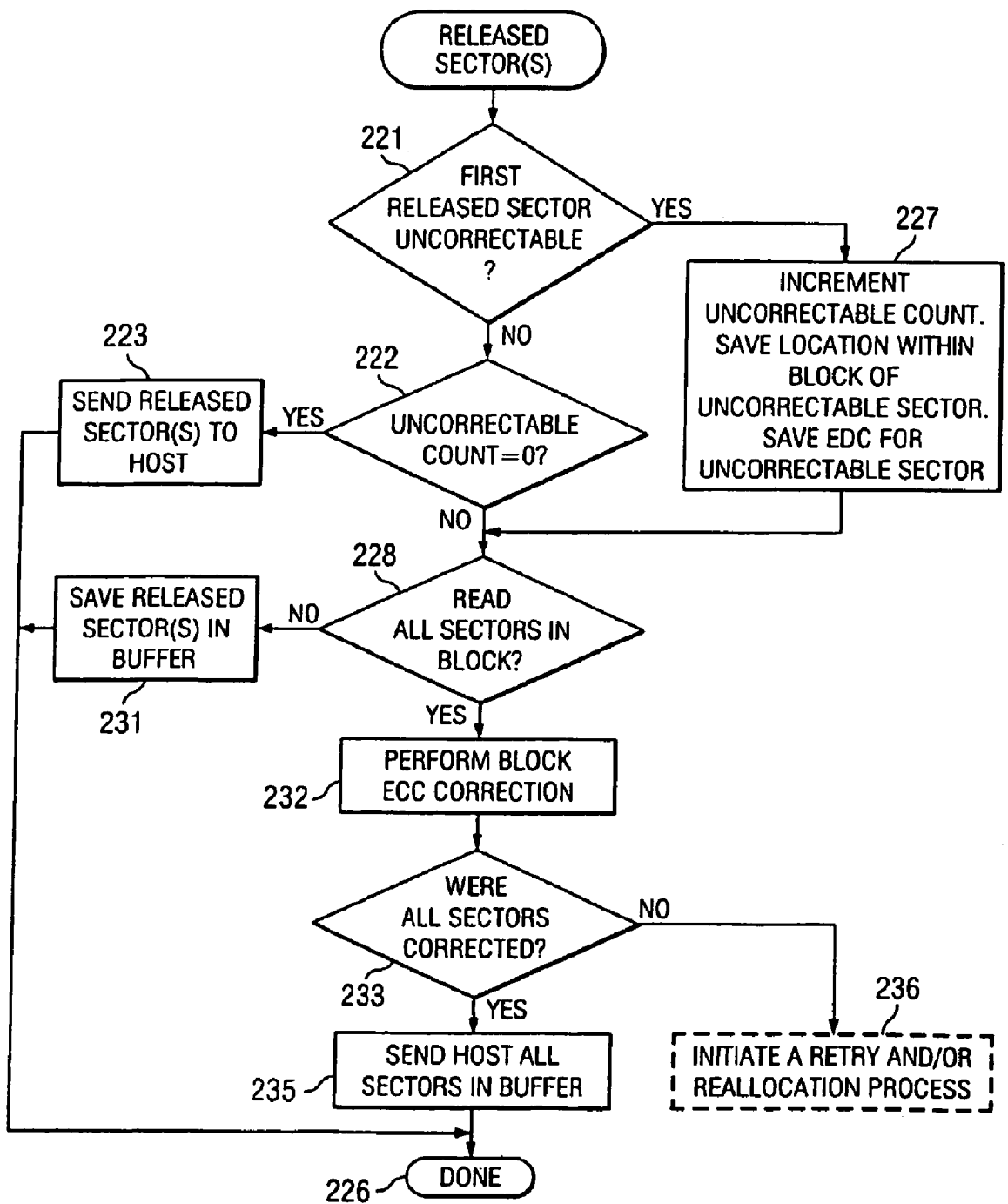

As discussed above, block 189 in FIG. 4 and blocks 203 and 204 in FIG. 5 each release one or more sectors to another portion of the circuit 31. FIG. 6 is a high-level flowchart showing a sequence of operations carried out by this other portion of the circuit 31. As evident from the foregoing discussion, one or more sectors may be released at a time, but only the first sector may possibly contain an error which is uncorrectable. Therefore, at block 221, a check is made to see whether the first sector has an uncorrectable error, or in other words whether an error was detected but could not be corrected at the sector level using the sector ECC information within that sector. If there is no indication of an uncorrectable error, then control proceeds to block 222, where the circuit 31 checks to see whether the uncorrectable count is zero. If the count is zero, then the circuit 31 has not yet encountered any sector in the block which had an error that could not be corrected at the sector level. Therefore, at block 223, the user data from each of the released sectors is sent to the host computer 13. The EDC information and sector ECC information from these sectors is not sent to the host. Control then proceeds to block 226, which is the end of the sequence of FIG. 6.

Referring again to block 221, if it is determined that the first sector did contain an uncorrectable error, it means that the circuit 31 will need to attempt to correct that error using the block ECC information stored in the last 7 sectors of the block 22. But in order to attempt any block ECC correction, the control circuit 31 must first read all of the remaining sectors in the block. Accordingly, control proceeds from block 221 to block 227, where the control circuit 31 increments the uncorrectable count to indicate that another uncorrectable error has been found, and then saves the location within the block 22 of the uncorrectable sector. The circuit 31 may also save the EDC value for the uncorrectable sector. The circuit 31 does not need to save the sector ECC information from that sector, because the sector ECC information has already been used in an unsuccessful attempt to correct the error, and will not be needed again.

From block 227, control proceeds to block 228. Control also proceeds to block 228 from block 222, whenever it is determined in block 222 that the uncorrectable count is greater than zero. Block 228 is only reached if the circuit 31 has determined that it needs to read all of the sectors in the block 22 in preparation to attempt a correction using the block ECC information. At block 228, the circuit 31 checks to see whether it has read all 255 sectors in the block 22. If not, then control proceeds to block 231, where the circuit 31 saves in the buffer 32 the sector or sectors which have just been released. Control then proceeds from block 231 to block 236.

If it is determined in block 228 that the circuit 31 has just finished reading the last unread sector from the block 22, then control proceeds to block 232, where the circuit 31 causes the block ECC correction circuit 57 (FIG. 1) to use the block ECC information in the last 7 sectors of the block 22 to attempt to correct the errors which were detected in the user data but could not be successfully corrected using the sector ECC information. When the block ECC correction circuit 57 has finished its efforts to correct errors, control proceeds to block 233, where the circuit 31 checks to see whether the block ECC correction circuit 57 was successful in correcting all remaining errors within the user data of the block 22. If so, then control proceeds to block 235, where the circuit 31 sends the host the user data from all sectors which have been saved in the buffer memory 32 at block 231.

It would be very rare that there would be a determination at block 233 that there was any remaining error which had not been corrected. But in the event of this situation, control would proceed from block 233 to block 236, where the circuit 31 would take some form of action which is not a part of the present invention and which is therefore not described here in detail. The circuit 31 might, for example, attempt to retry the block ECC correction process. Alternatively, the control circuit 31 might try to reallocate the data stored in the block 22 to a different block located elsewhere on the disk 16. Still another possibility is that the circuit 31 might notify the host computer 13 that it had detected an error which it could not correct, so that the host computer 13 could take appropriate action, such as notifying a user of the problem.

Figure 7:
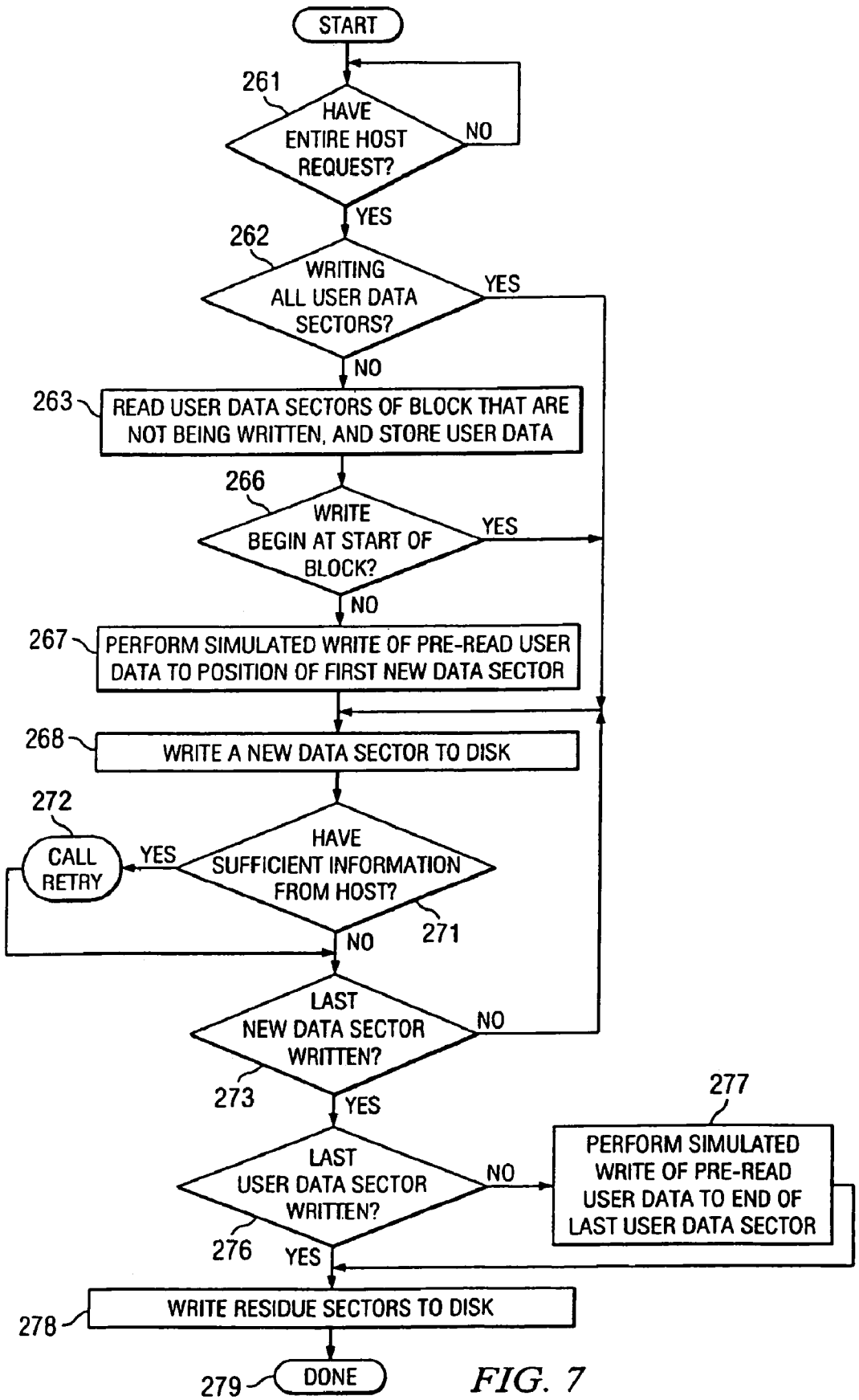
FIGS. 7 and 8 are high-level flowcharts showing sequences carried out to write data to a data block on the disk, while efficiently generating error detection and correction information which is stored with the data.

As mentioned above, the circuit 31 is not only capable of reading information from the disk 16, but is also capable of writing information to the disk 16. In this regard, FIG. 7 is a high-level flowchart showing a sequence carried out by the circuit 31 to accept user data from the host computer 13 and then store it on the disk 16. The sequence of FIG. 7 begins when the host computer 13 requests that the circuit 31 store some user data on the disk 16. The host may send the request and/or the user data in two or more segments. Consequently, at block 261, the circuit 31 waits until it has enough information to begin. For example, in the disclosed embodiment, the circuit 31 waits until it has received all of the user data that is to be stored in a specified block 22, which may be all of the user data in that block, or only a portion of the user data. The user data received from the host computer 13 is temporarily stored in the buffer memory 32, until it can be transferred to the disk 16. From block 261, control proceeds to block 262.

At block 262, the circuit 31 checks to see whether the request from the host computer 13 involves writing user data to every one of the 248 sectors of the block 22 which contain user data. If so, then several blocks are skipped, and control proceeds directly to block 268, which is discussed later. However, assuming that the host request does not involve replacing all of the user data in the block 22, control proceeds from block 262 to block 263. In block 263, the circuit 31 reads from disk 16 all sectors in the block 22 which contain user data which is not being changed by the host. The user data from these sectors is temporarily stored in the buffer memory 32, and control then proceeds to block 266.

At block 266, the circuit 31 checks to see whether the user data received from the host computer 13 begins with data which needs to be stored in the very first sector of the block 22. If so, then the next block 267 is skipped. Otherwise, control proceeds from block 266 to block 267, where the circuit 31 performs a simulated write of the user data which was read at block 263 from one or more sectors located at the beginning of block 22. The simulated write does not cause data to actually be written to the disk, but does cause the block ECC generation circuit 56 to generate block ECC information. The block ECC generation circuit 56 is not aware that the user data is not actually being written to the disk 16. The simulated write of the data can be carried out substantially faster than if the user data was actually being written to the disk 16. As one specific example, the simulated write in the disclosed embodiment can be carried out about four times faster, and possibly even faster that that. The simulated write continues for successive sectors in the block 22, until the circuit 31 reaches the first sector in which it is to store user data received from the host computer 13. Control then proceeds to block 268.

At block 268, the circuit 31 takes a segment of user data received from the host computer 13, and uses the EDC generation circuit 51 and the sector ECC generation circuit 61 to generate EDC information and sector ECC information. At the same time, the block ECC generation circuit 56 utilizes this user data to continue its ongoing generation of block ECC information. The segment of user data, along with the EDC information and sector ECC information from circuits 51 and 61, constitutes a sector which is actually written to the disk at block 268.

Then, at block 271, the circuit 31 checks to see whether any error has occurred. This is not a check for an error in the user data. Instead, this is a check for other types of errors. One example of such an error is where the section 14 determines that feedback control of the radial position of the read/write head has allowed the head to stray too far from the centerline of the track to which it is writing data. If any such error is detected, then control proceeds from block 271 to block 272, where the circuit 31 initiates a retry operation, which is discussed later.

Ultimately, control reaches block 273, where the circuit 31 checks to see whether all of the user data received from the host computer 13 has been written to the disk 16. If not, then control returns to block 268, in order to actually write another segment of the user data to the disk 16 in the form of another sector. Otherwise, control proceeds from block 273 to block 276, where the circuit 31 checks to see whether the sector which it just finished writing to the disk is the last of the 248 sectors in the block 22 that contain user data. If it is, then block 277 is skipped.

Otherwise, control proceeds from block 276 to block 277, where the circuit 31 performs a simulated write for each of the remaining sectors that contain user data, utilizing the user data from those sectors which was read from the disk in block 263. As this occurs, the block ECC generation circuit 56 is continuing to generate block ECC information. From block 277, control proceeds to block 278.

At this point, the block ECC generation circuit 56 will have successively processed all of the 248 segments of user data stored in the block 22 on the disk, and will thus have generated 7 new 512-byte segments of block ECC information which need to be stored in the last 7 sectors of the block 22 on the disk 16. Accordingly, at block 278, these 7 sectors are each successively written to the disk 16. As each of these 7 sectors is written to the disk, the EDC generation circuit 51 and the sector ECC generation circuit 61 generate EDC information and sector ECC information which become a part of each such sector. Control then proceeds to block 279, which is the end of the sequence involved in writing data to the block 222 on the disk 16.

Figure 8:
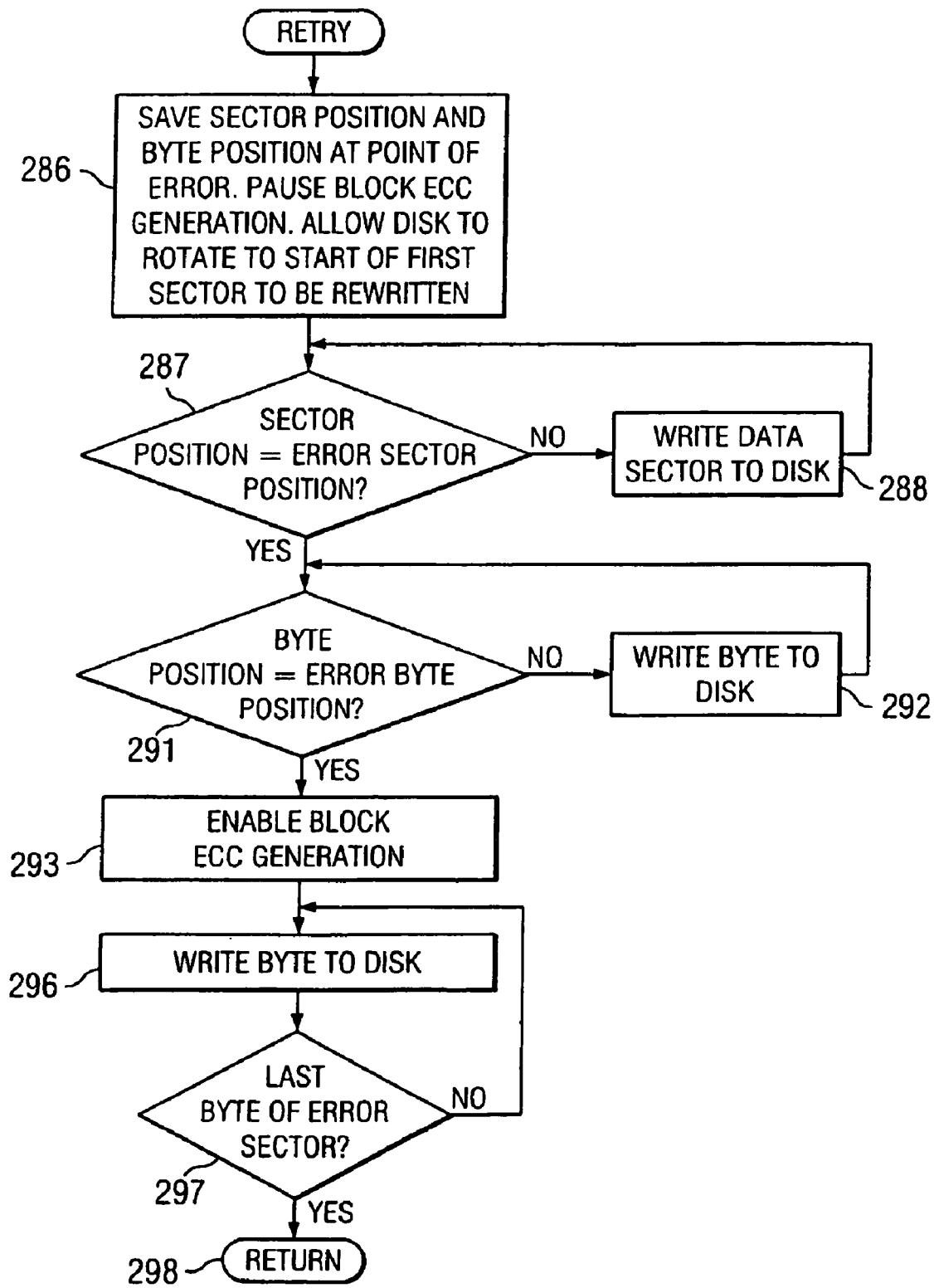

As discussed above, the circuit 31 may detect an error at block 271, for example where the feedback control of the radial position of the read/write head has allowed the read/write head to stray too far from the centerline of the track to which it is writing data. In that event, and as discussed above, a retry procedure is initiated at block 272. FIG. 8 is a high-level flowchart showing a sequence which is carried out in the event that a retry is initiated at block 272.

At block 286, the circuit 31 saves an indication of the position within the block 22 of the sector which it was trying to write when the error was identified, and the position within that sector of the byte which it was trying to write when the error was identified. The circuit 31 then pauses the operation of the block ECC generation circuit 56. The position of the write head is typically checked only at periodic intervals, and several sectors of data would typically be written to the disk between successive checks of the head position. Consequently, when it is determined that a problem has occurred, it may be necessary to rewrite data in all of the sectors which have been written since the immediately prior check of the head position, when it was determined that the head was properly positioned. The circuit 31 therefore makes a determination of which sector is the first sector that needs to be rewritten, which may be one or more sectors before the sector that was being written when the error condition was detected. Then, the circuit 31 allows the disk 16 to rotate through substantially a full revolution, until the read/write head is aligned with the start of the first sector which needs to be rewritten. Control then proceeds to block 287.

In block 287, the circuit 31 checks to see whether the read/write head has reached the start of the sector which was being written when the error was detected. If not, then the current sector is actually written to the disk, including user data, EDC information and sector ECC information. Control then returns to block 287 to handle the next sector. At some point, it will be determined in block 287 that the read/write head is positioned at the start of the sector which was being written when the error was detected. Control then proceeds to block 291.

In block 291, the circuit 31 checks to see whether the read/write head is positioned at the byte which it was writing when the error was detected. If not, then control proceeds to block 292, where the circuit 31 writes a byte of information to the disk 16, and then returns to block 291 to handle the next byte. At some point, it will be determined that the read/write head is positioned at the byte which was being written when the error was detected. Control then proceeds to block 293, where the circuit 31 enables the block ECC generation circuit 56, so that it will continue its generation of block ECC information from the point at which it left off when it was disabled.

Control then proceeds to block 296, where the circuit 296 writes to the disk a byte from the sector which was being written when the error was detected. The circuit 31 stays in a loop defined by blocks 296 and 297 until it has written all of the bytes of that sector to the disk. Control then proceeds to block 298, which returns control to block 272 of FIG. 7.

Although the foregoing discussion explains the invention in the context of a magnetic disk with concentric tracks, it will be recognized that there are aspects to the invention which can be utilized in a variety of other types of storage devices. Examples include compact disks, which do not have concentric tracks, and magnetic tapes, which store data linearly along the tape.

The present invention provides a number of advantages. One such advantage is that, when a host decides to store some user data which is less than all of the user data in a block, the system performs a simulated write of the other user data in the block, for the purpose of generating block-level error correction information, while reducing the amount of time required to carry out the operation of storing the user data received from the host. Another advantage is that, when only some of the data in a block is actually written to that block, the average occurrence of errors may be reduced over time, because some types of storage mediums have an error rate that progressively increases for any given portion thereof as the number of times data is written to that portion progressively increases. For example, repeated writes to rewritable compact disks will affect the error rate, due to what is sometimes called "laser rot", and it becomes more and more difficult to recover data from a rewritable compact disk that has been rewritten many times. The technique of actually writing only some of the data in a block also helps to avoid introducing new errors into the actual write process.

Yet another advantage is that, if a host requests user data representing only a portion of the user data in a block, the system initially reads only the sectors containing the requested user data. Unless one of these sectors contains an error which cannot be corrected with the error correction information in that sector, the remaining sectors of the block are not read from the disk.

Still another advantage is that, when an error is detected in a given sector and the sector is turned over to a correction circuit, the correction circuit is configured with several stages which successively carry out different portions of the correction process, and each such stage has associated with it an accumulator value representing the number of later sectors which have been successively read without a detected error. When the last stage of the correction circuit finishes processing a given sector, the associated accumulator value indicate how many sectors can be released for further processing when the given sector is released.

Figure 9:
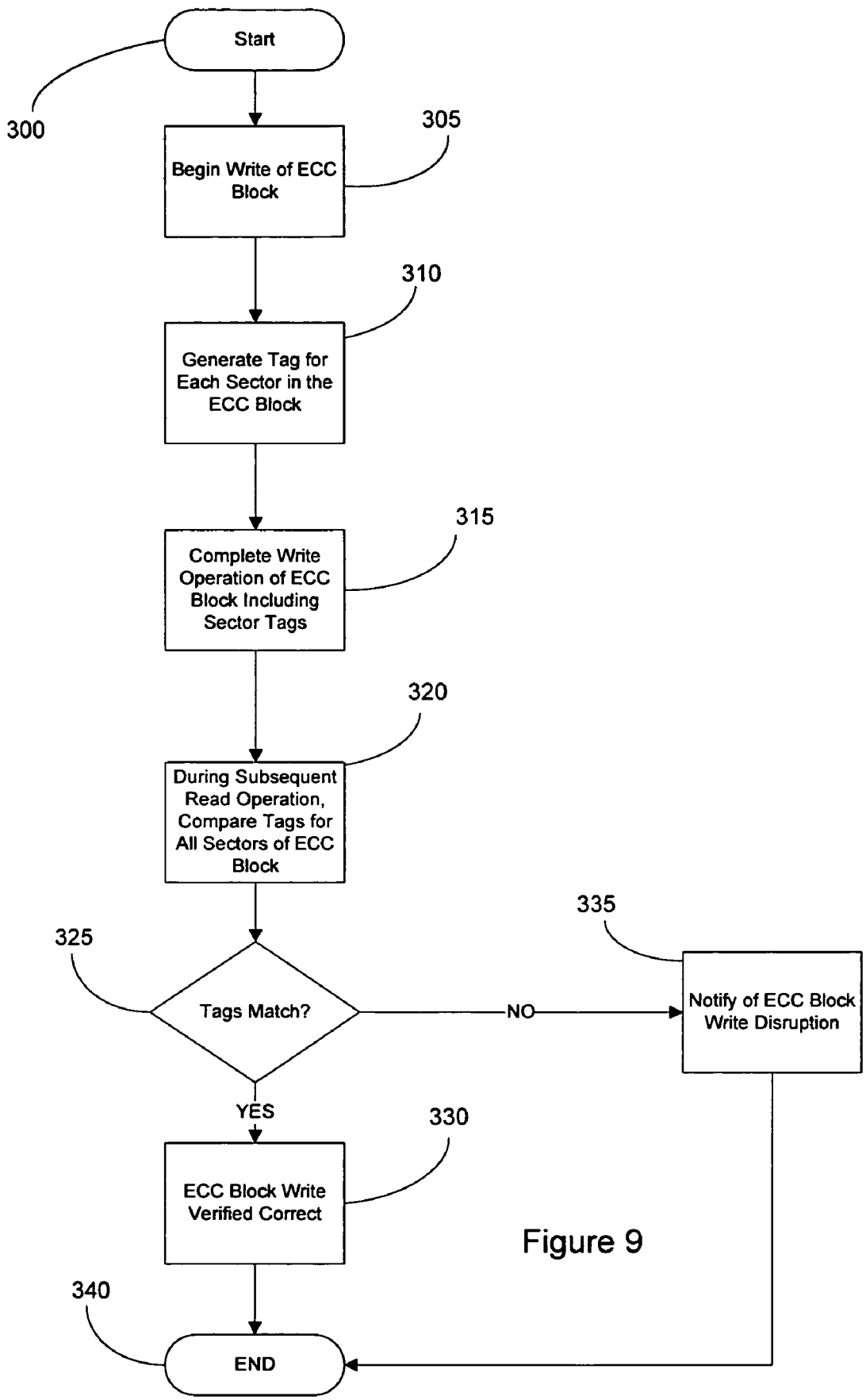
FIG. 9 is a flowchart showing use of a disk controller tag to detect disruption during the write of an ECC block.

FIG. 9 is a flowchart showing use of a disk controller tag to detect disruption during the write of an ECC block. If a disruption occurs during the write of an ECC block, then the ECC block will consist of both "new data" and "old data". A block ECC disruption can be caused by a number of factors, including power failures while writing, high fly write, host hang and other factors. An ECC block with old and new data can cause problems during read back. For example, if there are no "uncorrectable" sectors, then the "new data"/"old data" condition will be undetected and bad data may be passed to the host. Also, if the number of "uncorrectable" sectors is less than the capability of the block ECC, then the data could be miscorrected and passed to the host.

To help detect/correct a disruption during the write of an ECC block, one embodiment of the present invention uses the disk controller to add a "tag" to the each sector as described in FIG. 9. The process begins in START block 300. Proceeding to block 305, the process begins to write an ECC block. In block 310, the process generates a unique "tag" or flag for each sector in the ECC block. The same tag is written for every sector in the ECC block. This tag may be protected along with the user data within the sector ECC block. The tag should vary among the ECC blocks, and can be generated randomly, incrementally, or with any other method that ensures a variable tag is used for each ECC block. Although tags may be repeated throughout the disk surface, ECC blocks within a close proximity on the disk surface should have differing tags.

Proceeding to block 315, the writing of the ECC block is completed, including a tag for each of the sectors. At some later time, the process then proceeds to block 320, where during a read operation, all the tags for each sector of the ECC block are compared. If the write of the block ECC was not disrupted, then all the sectors should contain the same tag. However, if the write was disrupted, the tag would change upon the continuation of the write, and therefore there would be a change in the sector tags within the ECC block.

Proceeding to block 325, the process determines if all the sector tags in the ECC block match. If the tags do match, the process proceeds along the YES branch to block 330. In block 330, the ECC block write is verified as correct, and the process then terminates in END block 340. However, if all the sector tags in the ECC block are not identical, then an ECC block disruption must have previously occurred and the process proceeds along the NO branch to block 335. In block 335, the process notifies the host or firmware that a disruption occurred during the ECC block write. The firmware or host can then determine an appropriate action to take. After notifying of the ECC block write disruption, the process terminates in END block 340.

Figure 10:
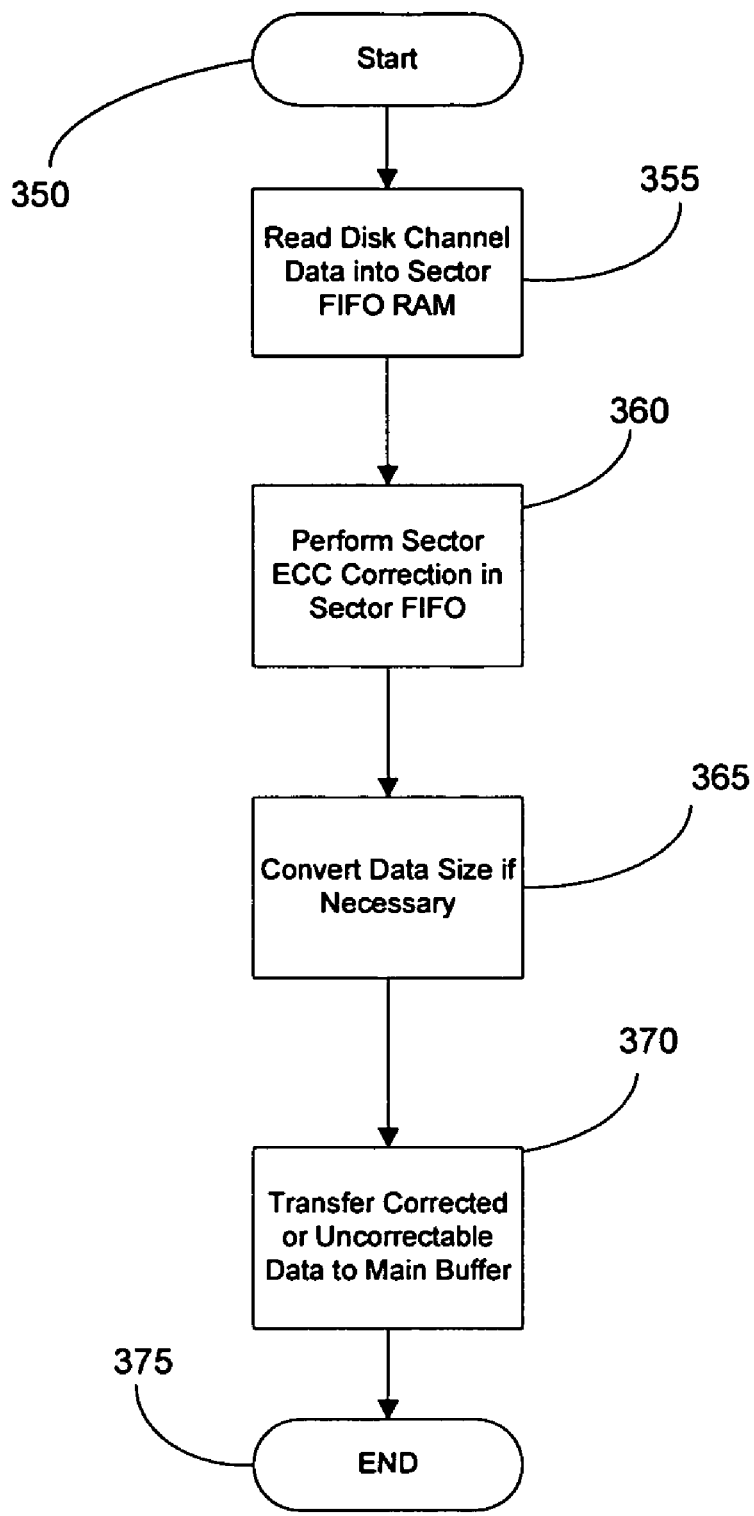
FIG. 10 is a flowchart showing use of sector FIFO RAM to perform sector ECC correction prior to transfer of data to the main buffer.

FIG. 10 is a flowchart showing use of sector FIFO RAM 60 to perform sector ECC correction prior to transfer of data to the main buffer 32. This process allows hardware ECC correction on-the-fly in two different data size domains. Sector (row) ECC correction is performed in the domain of the disk data channel while block (column) ECC correction is performed in the host interface domain.

The process begins in START block 350. Proceeding to block 355, the disk channel data is read into and captured by the sector FIFO RAM 60. This allows pacing and channel data synchronization to be handled at the sector level, rather than at the byte level. Proceeding to block 360, sector ECC correction is performed in the sector FIFO RAM 60 prior to transfer to the main buffer 32.

Proceeding to block 365, after the sector ECC correction is complete, the process converts the data from one data size domain to another if necessary. For example, the data in the sector FIFO RAM 60 may be 10-bit data, whereas the buffer 32 may use 8-bit data. The sector FIFO RAM 60 determines what data size is required by the buffer 32, and if that data size differs from the data size present in the sector FIFO RAM 60, a size conversion is performed. This allows the buffer to increase performance by only having to deal with data of the proper size. Because the size conversion is performed, no special addressing is required for disk side entities to access data in the main buffer 32. Sector ECC corrections may be performed in a different domain than the domain of the data in the main buffer. To correct main buffer data would require the sector ECC correction engine to contain complex addressing hardware for the main buffer.

Once the appropriate data size is achieved, the process proceeds to block 370 where the data is transferred into the main buffer 32. Because the sector ECC correction and size conversion is performed before the data is transferred, the data transferred to the buffer 32 is either good or uncorrectable and the sector ECC correction engine need not access the main buffer. This eases the bandwidth bottleneck of the main buffer thus improving system performance. After the data is transferred to the buffer 32, the process terminates in END block 375.

Numerous variations and modifications of the invention will become readily apparent to those skilled in the art. Accordingly, the invention may be embodied in other specific forms without departing from its spirit or essential characteristics.

What is claimed is:

1. A method for determining disruption during the write operation of an ECC block comprising:
   generating a tag at a start of a write operation of the ECC block;
   adding the tag to each of a plurality of sectors which comprise the ECC block during the write operation;
   comparing the tags for all of the plurality of sectors in the ECC block at any time after the write operation is complete; and
   determining a write disruption occurred if the tags for all of the plurality of sectors in the ECC block are not identical.

2. The method of claim 1, further comprising generating a notification if a write disruption is detected.

3. The method of claim 1, wherein the tag is generated using a random number generator.

4. The method of claim 1, further comprising logging write disruptions indicated by non- matching tags in memory.

5. The method of claim 1, further comprising determining whether a write error occured based on whether the tags for all of the plurality of sectors in the ECC block contain identical values.

6. The method of claim 1, further comprising determining that no write error occurred when the comparison step indicates that all of the tags in the plurality of sectors in the ECC block contain identical values.

7. The method of claim 1, further comprising determining that a write error occurred when the comparison step indicates that any of the tags in the plurality of sectors in the ECC block contain non-identical values.

8. A disk drive comprising:
a read/write head;
a data storage medium; and
control circuitry which transfers data from the data storage medium using the read/write head and performs error correction on the data to generate an ECC block comprising a plurality of sectors and writes the ECC block, wherein the control circuitry generates a tag prior to writing the ECC block and adds the tag to each of the plurality of sectors, wherein the control circuitry detects a write disruption when the tags for all of the plurality of sectors in the ECC block are not identical after writing.

9. The disk drive of claim 8, wherein the tags generated by the control circuit are modified at the beginning of any write operation.

10. The disk drive of claim 9, wherein the tags are randomly generated.

11. The disk drive of claim 8, wherein the control circuit generates an error notice if a write disruption occurs.

* * * * *